United States Patent [19]
Belke, Jr. et al.

[11] Patent Number: 5,909,839
[45] Date of Patent: Jun. 8, 1999

[54] METHOD FOR DISPENSING SOLDER PASTE ON A NON-PLANAR SUBSTRATE USING AN ARRAY OF ULTRASONICALLY AGITATED PINS

[75] Inventors: Robert Edward Belke, Jr., West Bloomfield; John Trublowski, Troy; Michael George Todd, South Lyon, all of Mich.

[73] Assignee: Ford Motor Company, Dearborn, Mich.

[21] Appl. No.: 08/857,159

[22] Filed: May 15, 1997

[51] Int. Cl.$^6$ .......................... B23K 35/12; B23K 31/02
[52] U.S. Cl. .......................... 228/248.1; 228/224
[58] Field of Search .................. 228/248.1, 223, 228/224, 256, 262, 111; 427/96

[56] References Cited

U.S. PATENT DOCUMENTS

| | | | |
|---|---|---|---|
| 4,946,708 | 8/1990 | Habich et al. | 427/96 |
| 5,186,982 | 2/1993 | Blette et al. | 427/256 |
| 5,435,481 | 7/1995 | Da Costa Alves et al. | 228/223 |
| 5,676,305 | 10/1997 | Potter et al. | 228/207 |

OTHER PUBLICATIONS

"DCC Connectors Are The Next Generation", Miraco, Inc., Connection Ideas, vol. 7, No. 1, 1996, p. 5.
"Automatic Flux Applicator", IBM Technical Disclosure Bulletin, vol. 34, No. 2, Jul. 1991, pp. 356–357.

*Primary Examiner*—Patrick Ryan
*Assistant Examiner*—Carlos J. Gamino
*Attorney, Agent, or Firm*—Joseph W. Malleck; Roger L. May

[57] ABSTRACT

A method is provided for applying a fluid to a plurality of locations on a non-planar substrate. The apparatus used includes a movable base and an array of pins connected to the base. Each pin has a distal end which is vertically movable with respect to the base independently of the rest of the array of pins. Each distal end is adapted to transfer fluid to a location on the substrate by having a greater affinity for the fluid than the fluid has for itself and a lesser affinity for the fluid than the fluid has for the substrate. Accordingly, the distal ends may be dipped in the fluid and moved into contact with the substrate such that the distal ends may collapse toward the base as the distal ends engage the substrate to facilitate further movement of the base toward the substrate for application of fluid to each of the plurality of locations.

3 Claims, 4 Drawing Sheets

METHOD FOR DISPENSING SOLDER PASTE ON A NON-PLANAR SUBSTRATE USING AN ARRAY OF ULTRASONICALLY AGITATED PINS

TECHNICAL FIELD

The present invention relates to a fluid dispensing method and apparatus, and more particularly to a method and apparatus for dispensing solder paste, adhesive, or other liquid or paste-like material at a plurality of locations on a non-planar substrate.

BACKGROUND OF THE INVENTION

Recent developments in the automotive industry have focused upon elimination of wiring harnesses and wiring boxes beneath vehicle instrument panels. One development, which is described in U.S. patent application Ser. No. 08/642,723, which is assigned to the assignee of the present application, discloses a method of overlaying circuit patterns directly onto instrument panel structural components. This method is very promising in that it reduces vehicle weight, reduces assembly and packaging problems, and simplifies the overall design.

A problem experienced with the application of circuit patterns directly onto vehicle structural components is that such structural components are typically three-dimensional or non-planar, therefore the circuit pattern must be applied onto the non-planar surface. Accordingly, dispensing solder paste onto discrete locations on the circuit pattern to form electrically conductive solder joints once the circuit pattern has been applied to the non-planar surface is problematic because efficient technology does not exist for applying solder at a plurality of discrete locations on a non-planar surface.

Screen printing approaches require substantially flat surfaces and require special tooling and construction features of limited utility for printing in recesses. Syringe dispensing is possible with many three-dimensional surfaces, however, x-direction and y-direction dispense head travel speed along with z-axial and theta angle positioning require a prohibitively long time in a high speed manufacturing scenario.

The same problem exists in applying surface-mounted electronic devices to non-planar surfaces. These surface-mounted electronic devices typically require an adhesive to hold the device in place when applied to an angled surface. However, efficient technology does not exist for rapidly applying such adhesive at discrete locations on non-planar surfaces.

Accordingly, it is desirable to provide a method and apparatus for applying solder paste and other fluids, such as glue, to non-planar three-dimensional substrates.

DISCLOSURE OF THE INVENTION

The present invention overcomes the above-referenced shortcomings of prior art fluid dispensing devices by providing a fluid transfer device which includes a movable base and an array of pins extending from the base, wherein each pin includes a distal end which is movable with respect to the base independently of the rest of the array of pins, such that the distal ends of the pins may transfer fluid to discrete locations on a non-planar surface.

More specifically, the present invention provides an apparatus for applying fluid to a plurality of locations on a non-planar substrate, including a movable base and an array of pins connected to the base. Each pin has a distal end which is vertically movable with respect to the base independently of the rest of the array of pins, wherein each distal end is adapted to transfer fluid to a location on the non-planar substrate. The distal ends of the pins have a greater affinity for the fluid than the fluid has for itself and a lesser affinity for the fluid than the fluid has for the substrate. Accordingly, the distal ends may be dipped in the fluid and moved into contact with the substrate such that individual distal ends may collapse toward the base as the distal ends engage the substrate to facilitate further movement of the base toward the substrate for application of fluid to each of the plurality of locations. The fluid may be a solder, glue, etc.

The present invention further provides a method of applying solder to a plurality of locations on a non-planar electronic substrate, comprising: 1) providing a solder transfer device including a movable base with an array of pins connected to the base, each pin having a distal end which is vertically movable with respect to the base independently of the rest of the array of pins; 2) dipping the distal ends of the pins in a tray of solder paste; and 3) moving the base toward the non-planar electronic substrate such that the distal ends of the array of pins contact the plurality of locations for applying the solder paste to the locations.

Accordingly, an object of the present invention is to provide a method and apparatus for dispensing fluid at a plurality of discrete locations on a non-planar surface of a substrate.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1A:
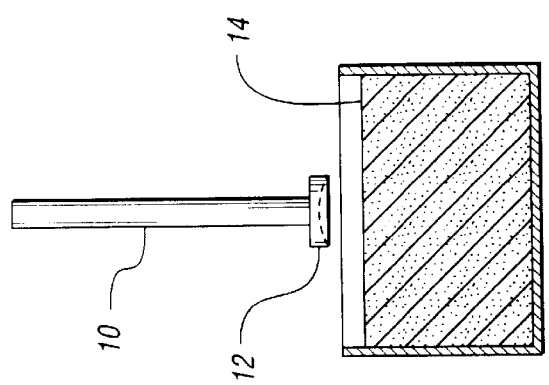
FIGS. 1a–1f schematically illustrate a sequence of dipping a pin in a solder paste and applying the pin to a substrate to dispense the solder paste on the substrate in accordance with the present invention.
Figure 1B:
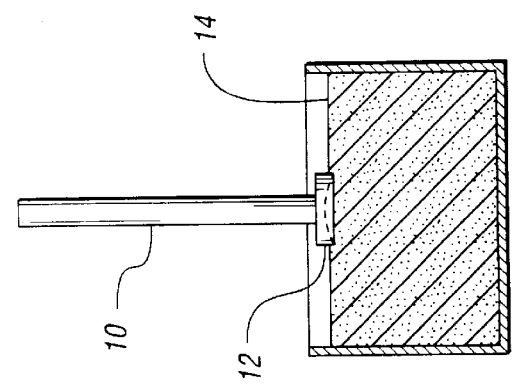
Figure 1C:
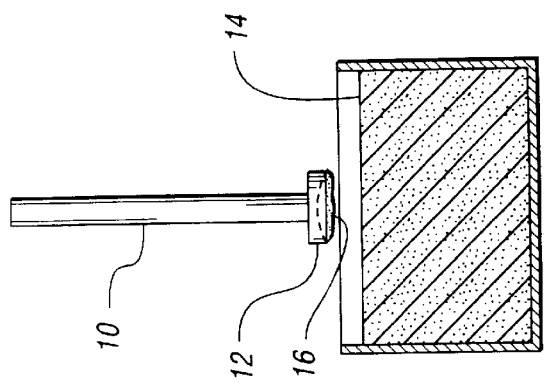
Figure 1D:
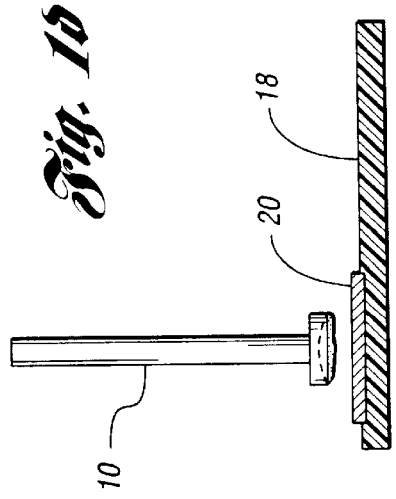
Figure 1E:
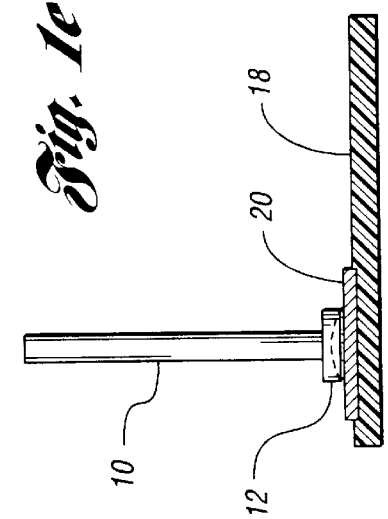
Figure 1F:
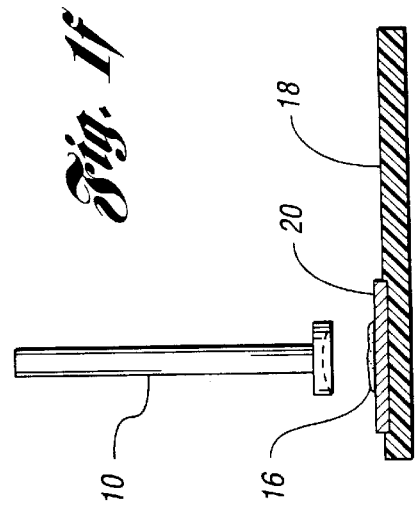

FIGS. 1a–1f schematically illustrate a sequence of transferring solder paste to a solder pad on a substrate. As shown, a pin 10 with a distal end portion 12 is moved toward and dipped in a tray of solder paste 14 in FIGS. 1a and 1b, and withdrawn from the solder paste with a droplet of solder 16 remaining on the distal end 12 of the pin 10, as shown in FIG. 1c. The pin 10 is then positioned over a substrate 18 with a solder pad 20 thereon, as shown in FIG. 1d. The distal end 12 of the pin 10 is then brought into contact with the pad 20, and removed from the pad 20 to leave the solder paste droplet 16 on the pad 20, as shown in FIGS. 1e and 1f.

Figure 2A:
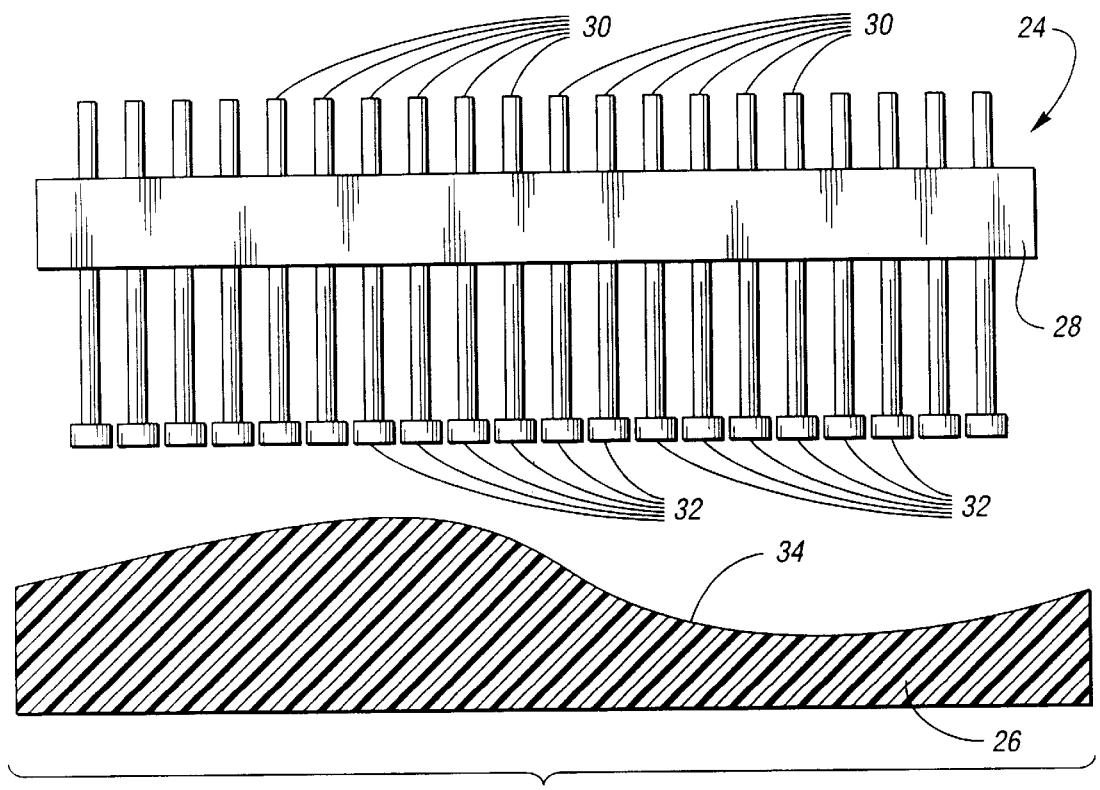
FIG. 2a shows a schematic side view of an apparatus for applying fluid to a plurality of locations on a non-planar substrate in accordance with the present invention.
Figure 2B:
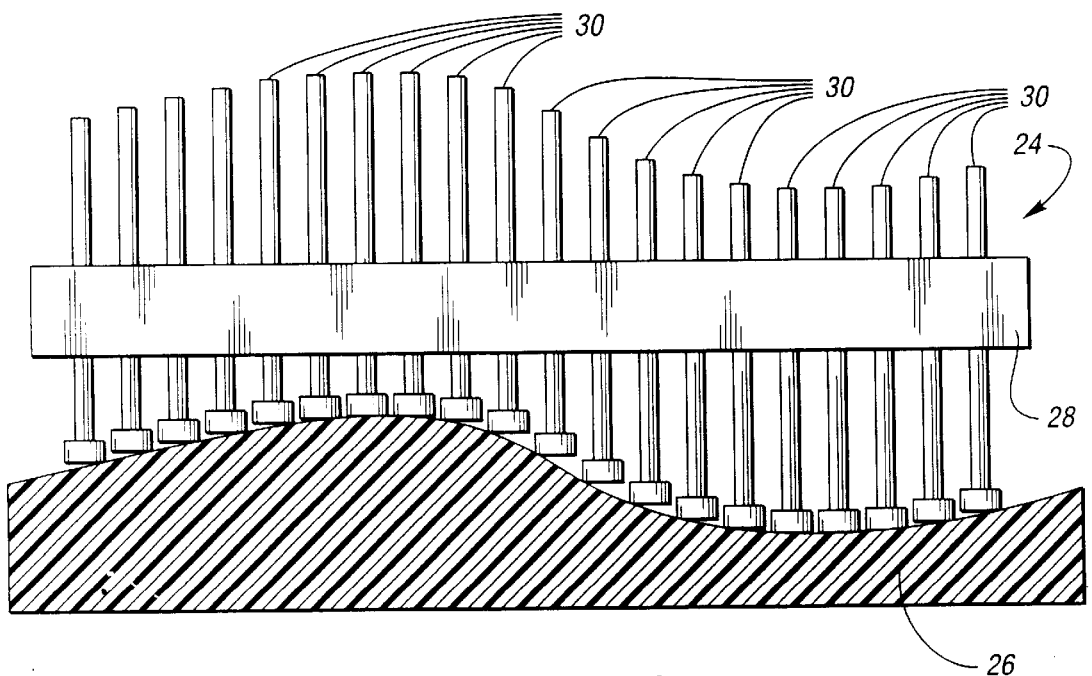
FIG. 2b shows the apparatus and substrate of FIG. 2a with the apparatus in contact with the substrate.

Turning to FIGS. 2a and 2b, a method and apparatus for applying solder to a non-planar surface of a substrate is shown schematically. The apparatus 24 for applying solder to a plurality of locations on a non-planar substrate 26 includes a movable base 28 with an array of pins 30 slidably mounted for vertical movement with respect to the base 28. Each of the array of pins 30 includes a distal end 32 adapted for transferring solder paste to a solder location. As shown, the substrate 26 includes a non-planar surface 34. Because the pins 30 are allowed to float with respect to the base 28, the distal ends 32 of the pins 30 will conform with the contoured shape of the non-planar surface 34 of the substrate 26 for application of solder at discrete locations along the surface 34.

The pins 30 could be moved merely by gravity, or they could be under computer control, and data could be transferred from CAD equipment to set the pin height according to the substrate surface 34. The pins 30 could then be pneumatically or electromechanically driven to the desired height for properly positioning the distal ends 30 of the pins for solder transfer.

Figure 3:
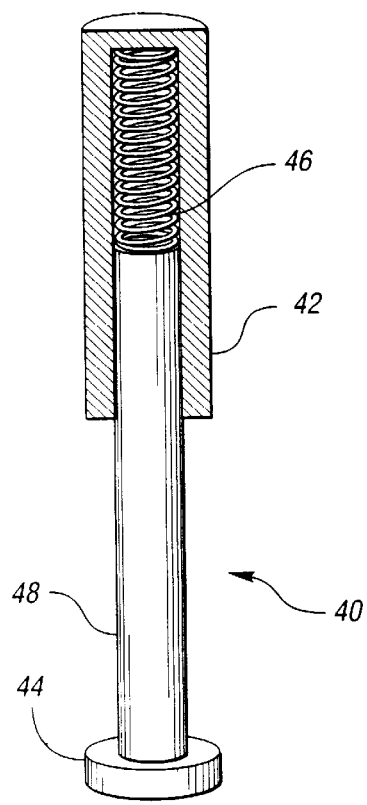
FIG. 3 shows a schematically arranged sectional view of a transfer pin in accordance with an alternative embodiment of the present invention.

FIG. 3 shows an alternative pin design 40 in which the pin assembly has a distal end portion 44 which is movable vertically with respect to the pin 42 by means of a compressible spring 46 which engages a shaft 48 for allowing such respective vertical movement.

Figure 4A:
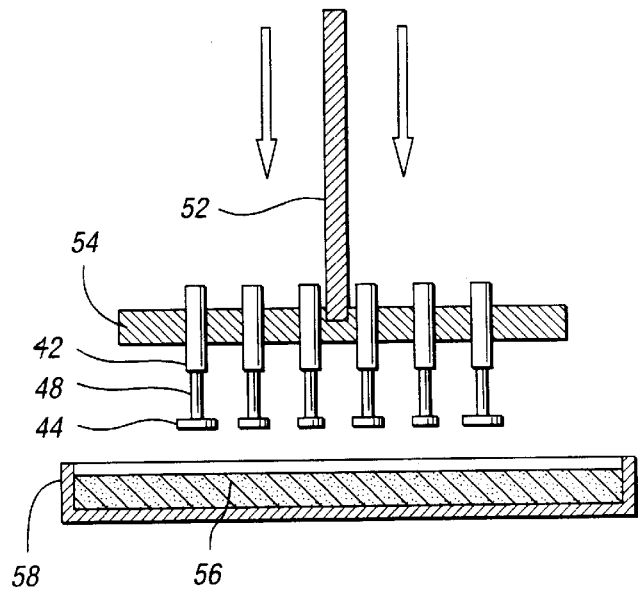
FIGS. 4a–4c schematically illustrate cross-sectional views of a sequence of applying a fluid to a non-planar surface in accordance with the embodiment illustrated in FIG. 3.
Figure 4B:
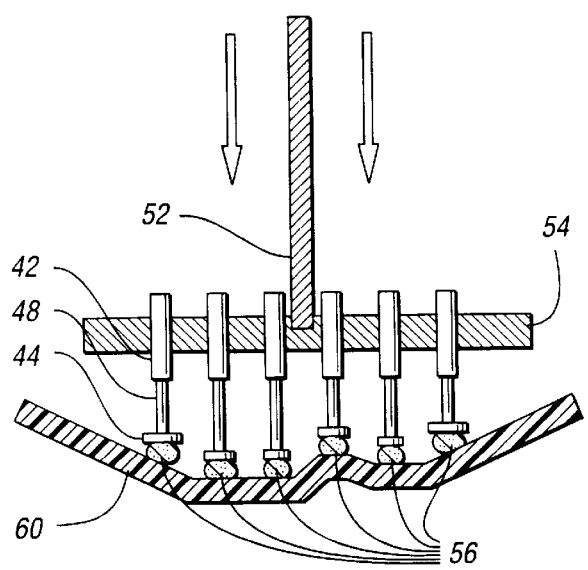
Figure 4C:
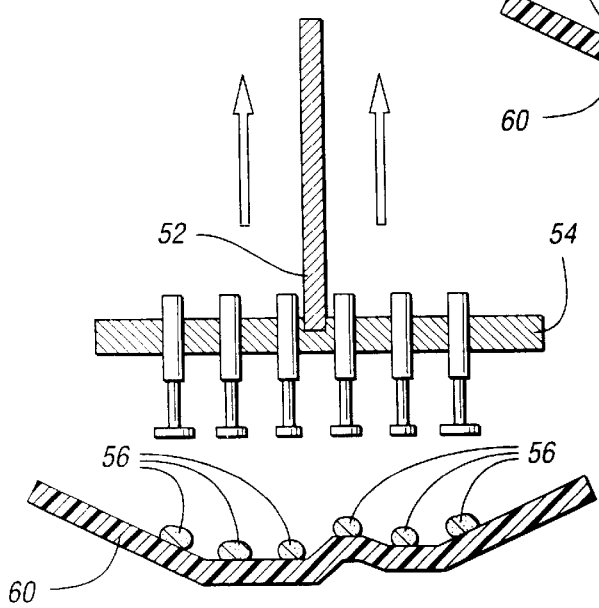

Implementation of the embodiment shown in FIG. 3 is illustrated in FIGS. 4a–4c. As shown, a driver 52 is used for moving the movable base 54, which includes pins 42 connected thereto. As illustrated in FIG. 3, each pin comprises a shaft 48 which is spring-loaded with respect to the pin 42, and a distal end portion 44 connected to the shaft 48. As illustrated, the distal ends 44 may comprise different geometries for transferring different amounts of paste.

As shown in FIG. 4a, the distal ends 44 are dipped in the paste 56 in the tray 58. The driver 52 then pulls the base 54 and pins away from the tray 58 and positions the pins over the three-dimensional substrate 60 to which the paste will be applied. The driver 52 then moves the base 54 so that the distal ends 44 contact the substrate 60 for applying the paste to the substrate. As shown in FIG. 4c, the driver 52 then pulls the base 54 and pins away from the substrate 60, leaving the solder paste on the substrate 60.

A second alternative embodiment of the invention is illustrated in FIGS. 5a–5d. As shown in this embodiment, the tray 70 is covered with a plate 72 having apertures 74, 76, 78 formed therethrough to allow only selected pins of the array of pins 80 to pass through the plate 72 to be dipped in the solder paste 82 (or adhesive, etc.).

Figure 5A:
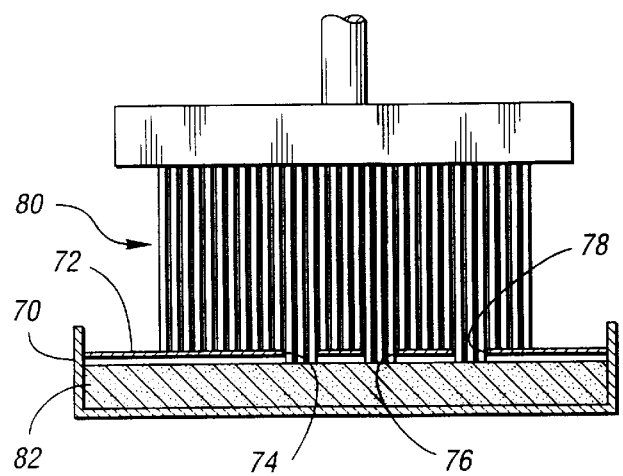
FIGS. 5a–5d schematically illustrate a method of applying a fluid to a non-planar substrate surface in accordance with a second alternative embodiment of the present invention.
Figure 5B:
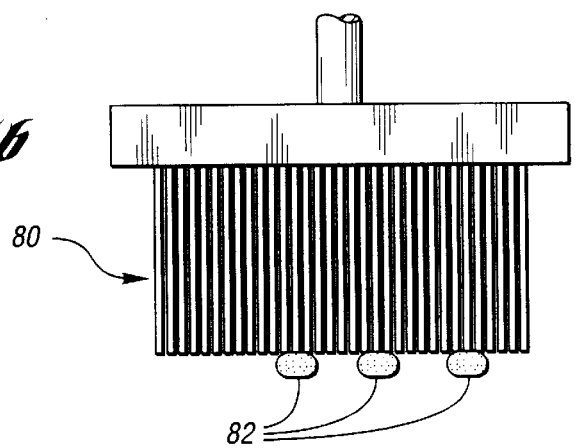
Figure 5C:
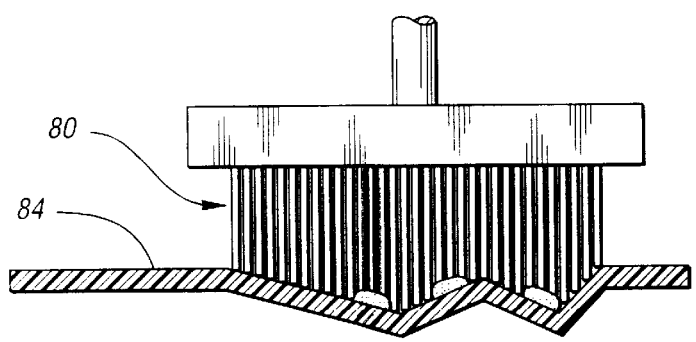
Figure 5D:
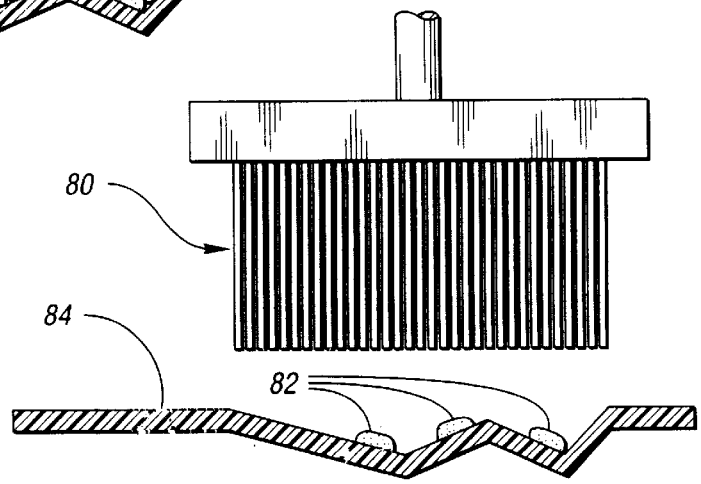

Accordingly, as shown in FIG. 5b, only certain pins of the array of pins 80 have solder 82 thereon as a result of the apertures 74, 76, 78 formed in the stencil plate 72 of the tray 70. As shown in FIG. 5c, the array of pins 80 is then moved into contact with a substrate 84, depositing the solder droplets 82 at selected locations along the non-planar surface of the substrate 84. As illustrated in FIG. 5d, the array of pins 80 is then moved away from the substrate 84, leaving the solder droplets 82 on the substrate 84. Using this concept, stencil tray plates may be specifically designed with appropriate openings formed therethrough corresponding with preferred locations for application of solder on a substrate.

The relative affinity of the solder paste for the distal end of the pin is greater than the cohesive strength of the solder paste, which allows the distal ends of the pin to pick up droplets of solder paste. This is accomplished by surfactant and rheological modification of the paste along with specialized pin coatings. The affinity of the paste is also greater for the solder pad than it is for the pin, which allows efficient paste transfer during the process. The pins may be coated with some material like sintered Teflon, titanium nitride, or the surface may be hardened.

The transfer pins may have a variety of distal end head designs. The distal ends of the pins may be straight, flared, pointed, fluted, serrated, etc. The distal ends could also be round or could include a ball joint configuration to allow slope conformance on angled surfaces. As described earlier, multiple pins may be used to transfer the desired amount of solder, and the pins may be spring-loaded or individually or group-actuated with a number of electronic or mechanical devices. Ultrasonic agitation may be used to provide efficient transfer of solder paste. The pins may also be hollow to provide for an array of syringes to provide a high volume of paste in a small area. Such an array of syringes could be pneumatically actuated, and the pin array could alternatively be heated or cooled to assist in solder paste transfer or to assist in the subsequent reflow process.

The pins may also be heated to enable the transfer of molten solder droplets to the pad and/or components. This eliminates the high temperature solder reflow processing for temperature-sensitive substrates.

The transfer pin array may be custom configured for the specific part on which solder paste is to be dispensed, or could be a generic array in which specific pins could be used for specific dispense situations. This attribute allows for rapid flexible manufacturing.

This same basic apparatus may be used to rapidly dispense other electronic packaging materials in three dimensions, such as solder fluxes, conformal coatings, and surface mount device adhesives. Surface mount device adhesive attachment is useful, not only for bottom side component processing through a solder wave, but also for anchoring devices to flat and angled surfaces during handling prior to reflow.

While the best modes for carrying out the invention have been described in detail, those familiar with the art to which this invention relates will recognize various alternative designs and embodiments for practicing the invention within the scope of the appended claims.

What is claimed is:

1. A method of applying solder to a plurality of locations on a three-dimensional non-planar electronic substrate, comprising:

providing a solder transfer device including a movable base with an array of pins connected to the base, each pin having a distal end which is vertically movable with respect to the base independently of the rest of the array of pins;

dipping the distal ends of said pins in a tray of solder paste;

moving the base toward the non-planar electronic substrate such that the distal ends of the array of pins contact the plurality of locations for applying the solder paste to the locations, and ultrasonically agitating the array of pins to encourage solder transfer from the pins to the substrate.

2. The method of claim 1, wherein said step of providing a solder transfer device comprises providing a movable base with an array of pins slidably mounted for vertical movement with respect to the base, wherein said pin includes a distal end adapted for transferring solder paste to a solder location.

3. The method of claim 1, wherein said step of providing a solder transfer device comprises providing a movable base with an array of pins rigidly secured to the base, and wherein each said pin includes a distal end portion secured to the pin and spring-loaded with respect to the pin to facilitate vertical movement of the distal end portion with respect to the pin.

* * * * *